(12) United States Patent
Sarver

(10) Patent No.: US 8,025,269 B1
(45) Date of Patent: Sep. 27, 2011

(54) CHAMBER LID LIFTING APPARATUS

(75) Inventor: Roger P. Sarver, Gorham, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 1015 days.

(21) Appl. No.: 11/975,060

(22) Filed: Oct. 16, 2007

(51) Int. Cl.
*B66F 3/10* (2006.01)

(52) U.S. Cl. ......................... 254/131; 254/243; 254/123

(58) Field of Classification Search ............. 254/131, 254/243, 123; 410/103, 112; 16/110.1; 81/177.1, 81/177.7, 177.8
See application file for complete search history.

(56) References Cited

U.S. PATENT DOCUMENTS

| | | | | |
|---|---|---|---|---|
| 1,938,807 A * | 12/1933 | Byers | | 254/131 |
| 3,452,963 A * | 7/1969 | Holst, Sr. et al. | | 254/131 |
| 3,843,981 A * | 10/1974 | Verest | | 7/170 |
| 4,236,427 A * | 12/1980 | Becnel | | 81/15.9 |
| 5,921,597 A * | 7/1999 | Thiele | | 294/17 |
| 6,107,192 A | 8/2000 | Subrahmanyan et al. | | |
| 6,165,271 A | 12/2000 | Zhao et al. | | |
| 6,196,092 B1 * | 3/2001 | Potter | | 81/488 |
| 6,217,715 B1 | 4/2001 | Sun et al. | | |
| 6,476,367 B2 | 11/2002 | Maung | | |
| 6,630,995 B1 | 10/2003 | Hunter | | |
| 6,663,083 B1 * | 12/2003 | Smith | | 254/25 |
| 6,752,382 B2 * | 6/2004 | Barto | | 254/131 |
| 6,776,848 B2 * | 8/2004 | Rosenstein et al. | | 118/726 |
| 6,882,416 B1 | 4/2005 | Hunter et al. | | |
| 6,964,407 B1 * | 11/2005 | Butler | | 254/131 |
| 7,371,285 B2 * | 5/2008 | Rosenstein et al. | | 118/715 |
| 7,389,971 B2 * | 6/2008 | Gaudreault et al. | | 254/243 |
| 2002/0072164 A1 * | 6/2002 | Umotoy et al. | | 438/200 |
| 2002/0113065 A1 | 8/2002 | Maung | | |
| 2002/0117262 A1 * | 8/2002 | Pang et al. | | 156/345.1 |
| 2003/0075710 A1 * | 4/2003 | Sim | | 254/131 |
| 2004/0251130 A1 * | 12/2004 | Liu et al. | | 204/298.01 |
| 2009/0159861 A1 * | 6/2009 | Gray et al. | | 254/131 |

* cited by examiner

*Primary Examiner* — George Nguyen

(57) ABSTRACT

A chamber lid lifting apparatus operable to lift a chamber lid of a semiconductor processing chamber is provided. The chamber lid lifting apparatus includes a handle. The handle includes a short end and a long end that together form a lever. The short end is operable to be temporarily coupled to a lid pivot point of the chamber lid. The long end is operable to transfer an applied force to the short end. The transferred force is operable to lift the chamber lid at the lid pivot point.

20 Claims, 3 Drawing Sheets

CHAMBER LID LIFTING APPARATUS

TECHNICAL FIELD

This disclosure is generally directed to semiconductor fabrication and, more specifically, to a chamber lid lifting apparatus for lifting lids of semiconductor processing chambers.

BACKGROUND

Semiconductor processing chambers generally have relatively heavy lids. Typically, the lids are equipped with pneumatic/spring lift cylinders that assist a technician in opening the lids. However, during maintenance tasks or other tasks in which the assisting cylinders may not be used, a technician has to lift the lid unassisted. Often, these chambers are part of integrated tools where many chambers are in close proximity. Thus, it may be difficult for a technician to get good leverage in a suitable location for lifting a lid. As a result, the technician may be injured (for example, by straining his or her back) when trying to lift the lid without the help of assisting cylinders.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the term "each" means every one of at least a subset of the identified items; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior as well as future uses of such defined words and phrases.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Figure 1:
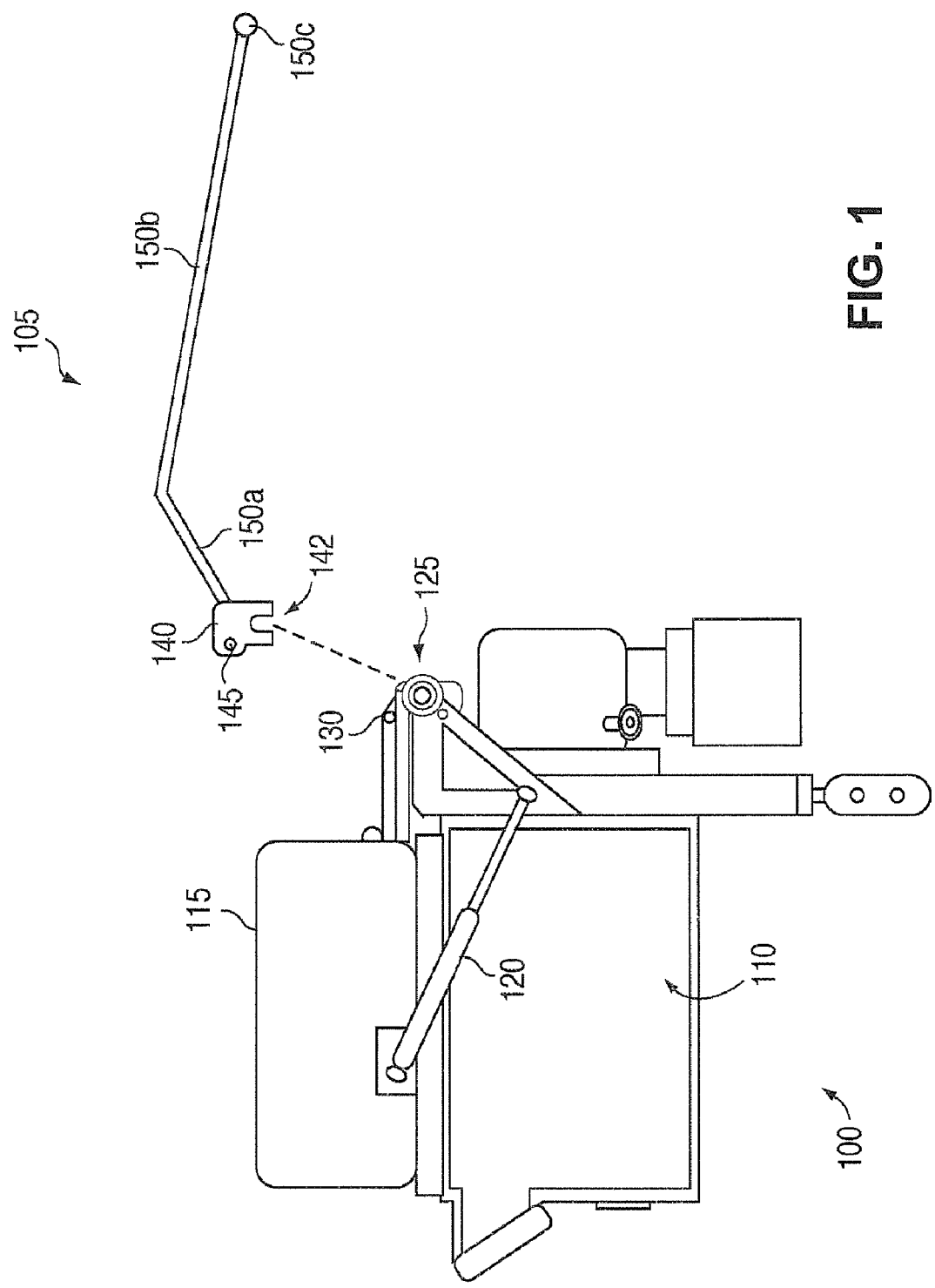
FIG. 1 illustrates a semiconductor processing chamber and a chamber lid lifting apparatus in accordance with one embodiment of the present disclosure.
Figure 2:
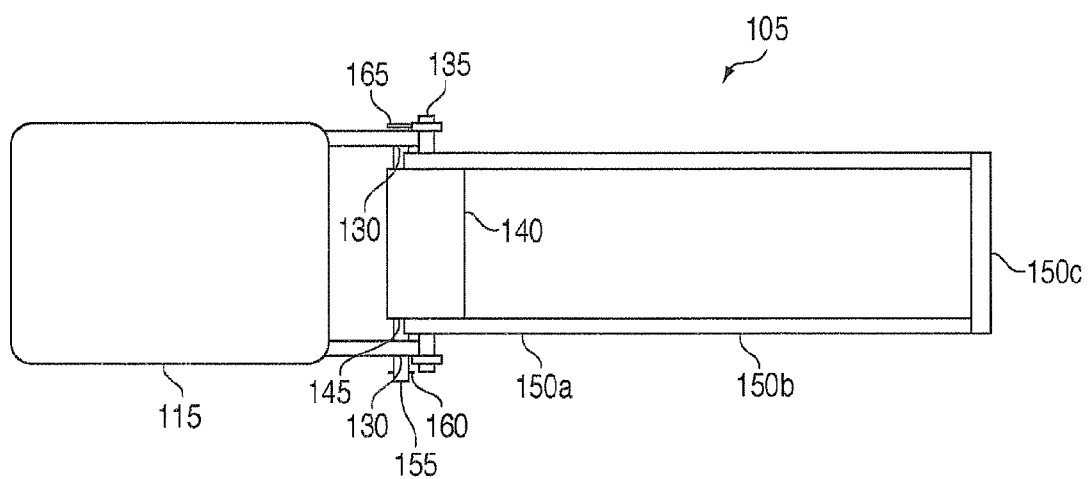
FIG. 2 illustrates a top view of the semiconductor processing chamber and the chamber lid lifting apparatus of FIG. 1 in accordance with one embodiment of the present disclosure.
Figure 3:
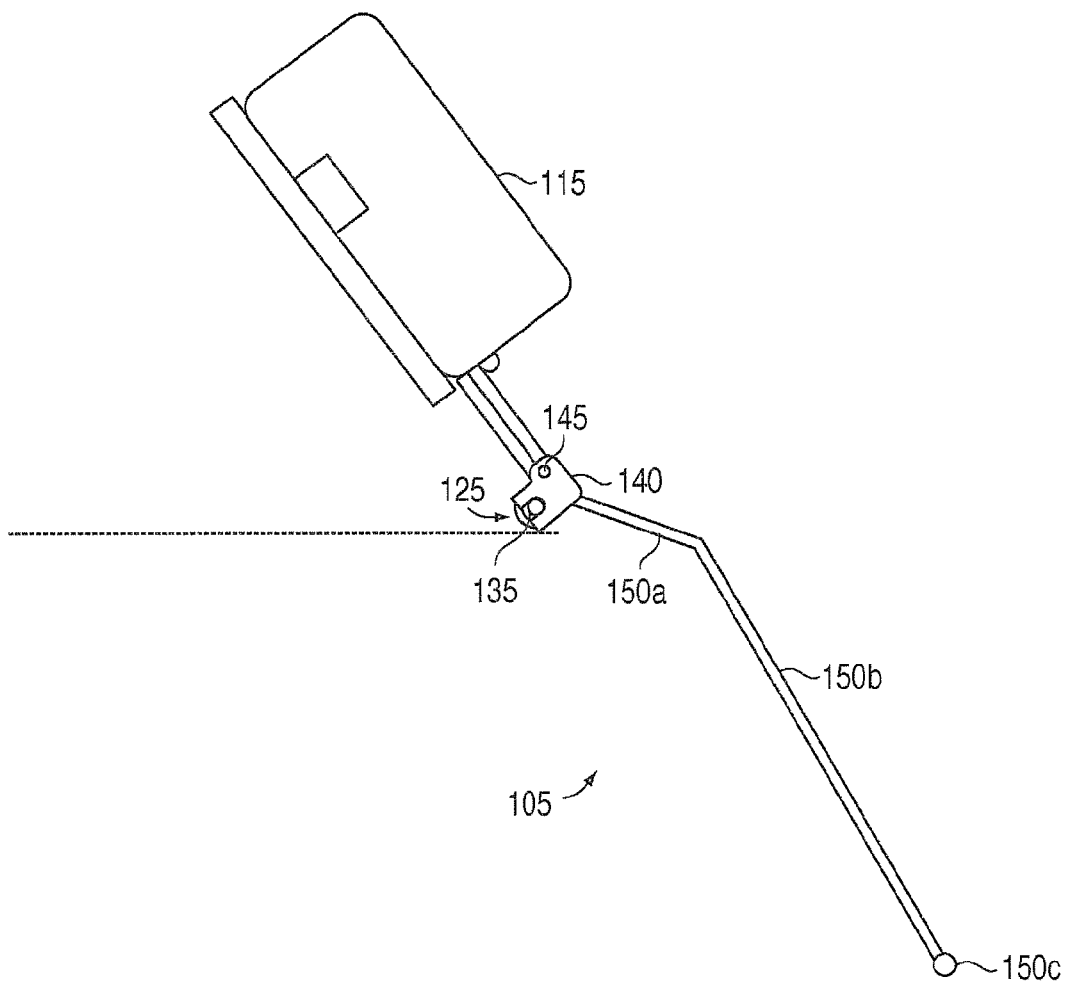
FIG. 3 illustrates the chamber lid lifting apparatus of FIGS. 1 and 2 holding the lid of the semiconductor processing chamber in an open position in accordance with one embodiment of the present disclosure.

FIGS. 1 through 3, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged chamber lid lifting apparatus.

FIG. 1 illustrates a semiconductor processing chamber 100 and a chamber lid lifting apparatus 105 in accordance with one embodiment of the present disclosure. The semiconductor processing chamber 100 comprises a chamber cavity 110 that may be covered by a chamber lid 115. FIG. 2 illustrates a top view of the semiconductor processing chamber 100 with the chamber lid lifting apparatus 105 attached, and FIG. 3 illustrates the chamber lid lifting apparatus 105 holding the chamber lid 115 of the semiconductor processing chamber 100 in an open position.

The semiconductor processing chamber 100 also comprises assisting cylinders 120, a lid pivot point 125, and a pair of chamber lid locking holes 130, in addition to any other suitable components. For one embodiment, the lid pivot point 125 may comprise bearings, a pivot bar 135 (shown in FIGS. 2 and 3), mounts and hinge connections. The chamber lid locking holes 130 are designed to lock the chamber lid 115 in place when the chamber lid 115 is in the open position.

For the illustrated embodiment, the chamber lid lifting apparatus 105 comprises a pivot bar mount 140, a chamber connection slot 145, a handle 150a-c, and a connection rod 155 and pin 160 (shown in FIG. 2). The pivot bar mount 140 is operable to be temporarily coupled to the chamber lid 115. As used herein, the phrase "temporarily coupled" means that the pivot bar mount 140 may be coupled to the chamber lid 115 for any suitable period of time and may be de-coupled from the chamber lid 115 thereafter.

The pivot bar mount 140 of the chamber lid lifting apparatus 105 has an end 142 that is shaped to securably engage the pivot bar 135 (which is part of the lid pivot point 125) of the semiconductor processing chamber 100, as indicated by the dashed line in FIG. 1. As used herein, the phrase "securably engage" means that the pivot bar mount 140 is shaped to fit snugly against the pivot bar 135. Thus, the pivot bar mount 140 is designed so as not to slip on the pivot bar 135 when the chamber lid lifting apparatus 105 is in use.

After securably engaging the pivot bar 135, the pivot bar mount 140 may be fastened to the chamber lid 115 via the connection rod 155. As illustrated in FIG. 2, the connection rod 155 is operable to be placed through a first one of the chamber lid locking holes 130, through the chamber connection slot 145, and finally through a second one of the chamber lid locking holes 130. The connection rod 155 comprises a rod base 165 that is operable to prevent the connection rod 155 from continuing to move past the first one of the chamber lid locking holes 130. The pin 160 is operable to be placed through an end of the connection rod 155 opposite the rod base 165 to prevent the connection rod 155 from sliding out of the chamber lid locking holes 130 and the chamber connection slot 145. Thus, after the connection rod 155 and pin 160 are in place, the pivot bar mount 140 is temporarily coupled to the chamber lid 115.

The handle 150 comprises a short end 150a and a long end 150b that together form a lever. The handle 150 may also comprise a cross bar 150c. The short end 150a of the handle 150 is coupled to the pivot bar mount 140, and the long end 150b of the handle 150 may be coupled to the cross bar 150c. The cross bar 150c, along with the long end 150b, is operable to receive a force applied by a technician pushing downward on the cross bar 150c. This force is transferred from the long end 150b of the handle 150 to the short end 150a, and thus to the pivot bar mount 140. The pivot bar mount 140, which is coupled to the chamber lid 115 as described above, then transfers this force to the chamber lid 115, causing the chamber lid 115 to be opened. As an alternative, for an embodiment in which the cross bar 150c is omitted, it will be understood that a technician may apply the force by pushing downward on the long end 150b of the handle 150.

After opening the chamber lid 115, the chamber lid lifting apparatus 105 may be used to hold the chamber lid 115 at any suitable angle to allow access to the chamber cavity 110. Thus, although FIG. 3 shows the chamber lid lifting apparatus 105 holding the chamber lid 115 at a particular angle with respect to the horizontal dashed line, it will be understood that the chamber lid lifting apparatus 105 may be used to hold the chamber lid 115 at any suitable angle without departing from the scope of this disclosure. In addition, the chamber lid lifting apparatus 105 may be used to lower the chamber lid 115 by steadily releasing the force on the cross bar 150c (or long end 150b) and allowing the cross bar 150c (or long end 150b) to move back upward until the chamber lid lifting apparatus 105 and the chamber lid 115 return to their original respective positions.

In this way, an inexpensive, easy-to-use, quick and safe chamber lid lifting apparatus 105 is provided to assist a technician in opening the chamber lid 115 of the semiconductor processing chamber 100 when the assisting cylinders 120 may not be used. Accordingly, the technician may lift the chamber lid 115 relatively easily by using the chamber lid lifting apparatus 105. As a result, the risk of injury to the technician is minimized.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A chamber lid lifting apparatus comprising:
  a handle comprising:
    a short end operable to be temporarily coupled to a lid pivot point of a chamber lid of a semiconductor processing chamber, the lid pivot point comprising a pivot bar; and
    a long end operable to form a lever with the short end, the long end operable to transfer an applied force to the short end in order to lift the chamber lid at the lid pivot point; and
  a pivot bar mount coupled to the short end of the handle, the short end of the handle operable to be temporarily coupled to the lid pivot point by the pivot bar mount, the pivot bar mount shaped to securely engage the pivot bar, the pivot bar mount comprising a chamber connection slot configured to receive a connection rod to temporarily couple the pivot bar mount to the chamber lid.

2. The chamber lid lifting apparatus of claim 1, the handle further comprising a cross bar coupled to the long end, the cross bar operable to provide the applied force to the long end.

3. The chamber lid lifting apparatus of claim 1, further comprising the connection rod, the connection rod operable to be placed through the chamber connection slot to couple the pivot bar mount to the chamber lid.

4. The chamber lid lifting apparatus of claim 3, the semiconductor processing chamber comprising a pair of chamber lid locking holes, the connection rod further operable to be placed through the chamber lid locking holes.

5. The chamber lid lifting apparatus of claim 4, the connection rod comprising a rod base on a first end of the connection rod, the rod base operable to prevent the connection rod from moving past one of the chamber lid locking holes.

6. The chamber lid lifting apparatus of claim 5, further comprising a pin operable to be placed through a second end of the connection rod, the pin operable to prevent the connection rod from sliding out of the chamber lid locking holes and the chamber connection slot.

7. A chamber lid lifting apparatus, comprising:
  a pivot bar mount operable to be temporarily coupled to a lid pivot point of a chamber lid of a semiconductor processing chamber; and
  a handle coupled to the pivot bar mount, the handle operable to transfer an applied force to the pivot bar mount in order to lift the chamber lid at the lid pivot point;
  wherein the pivot bar mount comprises a chamber connection slot configured to receive a connection rod to temporarily couple the pivot bar mount to the chamber lid.

8. The chamber lid lifting apparatus of claim 7, the lid pivot point comprising a pivot bar, the pivot bar mount shaped to securably engage the pivot bar.

9. The chamber lid lifting apparatus of claim 8, further comprising the connection rod, the connection rod operable to be placed through the chamber connection slot to couple the pivot bar mount to the lid pivot point of the chamber lid.

10. The chamber lid lifting apparatus of claim 9, the semiconductor processing chamber comprising a pair of chamber lid locking holes, the connection rod further operable to be placed through the chamber lid locking holes.

11. The chamber lid lifting apparatus of claim 10, the connection rod comprising a rod base on a first end of the connection rod, the rod base operable to prevent the connection rod from moving past one of the chamber lid locking holes.

12. The chamber lid lifting apparatus of claim 11, further comprising a pin operable to be placed through a second end of the connection rod, the pin operable to prevent the connection rod from sliding out of the chamber lid locking holes and the chamber connection slot.

13. The chamber lid lifting apparatus of claim 7, wherein the handle comprises:
  a short end coupled to the pivot bar mount; and
  a long end operable to form a lever with the short end.

14. A chamber lid lifting apparatus, comprising:
  a pivot bar mount comprising a chamber connection slot;
  a connection rod operable to be placed through the chamber connection slot to temporarily couple the pivot bar mount to a chamber lid of a semiconductor processing chamber; and
  a handle coupled to the pivot bar mount, the handle operable to transfer an applied force to the pivot bar mount in order to lift the chamber lid.

15. The chamber lid lifting apparatus of claim 14, the handle comprising a cross bar operable to receive the applied force.

16. The chamber lid lifting apparatus of claim 14, the semiconductor processing chamber comprising a pivot bar, the pivot bar mount shaped to securably engage the pivot bar.

17. The chamber lid lifting apparatus of claim 16, the semiconductor processing chamber further comprising a pair of chamber lid locking holes, the connection rod further operable to be placed through the chamber lid locking holes.

18. The chamber lid lifting apparatus of claim 17, the connection rod comprising a rod base on a first end of the connection rod, the rod base operable to prevent the connection rod from moving past one of the chamber lid locking holes.

19. The chamber lid lifting apparatus of claim 18, further comprising a pin operable to be placed through a second end of the connection rod, the pin operable to prevent the connection rod from sliding out of the chamber lid locking holes and the chamber connection slot.

20. The chamber lid lifting apparatus of claim 14, wherein the handle comprises:

a short end coupled to the pivot bar mount; and
a long end operable to form a lever with the short end.

* * * * *